United States Patent [19]
Wu

[11] Patent Number: 6,087,234
[45] Date of Patent: Jul. 11, 2000

[54] METHOD OF FORMING A SELF-ALIGNED SILICIDE MOSFET WITH AN EXTENDED ULTRA-SHALLOW S/D JUNCTION

[75] Inventor: Shye-Lin Wu, Hsinchu, Taiwan

[73] Assignee: Texas Instruments - Acer Incorporated, Hsinchu, Taiwan

[21] Appl. No.: 08/994,178

[22] Filed: Dec. 19, 1997

[51] Int. Cl.$^7$ ................................................. H01L 21/336
[52] U.S. Cl. ..................... 438/299; 438/305; 438/592; 438/595; 438/655
[58] Field of Search .................................. 438/299, 305, 438/304, 303, 301, 231, 682, 683, 664, 663, 660, 592, 655, 595

[56] References Cited

U.S. PATENT DOCUMENTS

| | | | |
|---|---|---|---|
| 4,855,247 | 8/1989 | Ma et al. | 438/305 |
| 4,912,061 | 3/1990 | Nasr | 438/231 |
| 5,168,072 | 12/1992 | Moslehi | 438/305 |
| 5,434,044 | 7/1995 | Nulman et al. | 438/663 |
| 5,668,024 | 9/1997 | Tsai et al. | 438/231 |
| 5,679,589 | 10/1997 | Lee et al. | 438/231 |
| 5,744,395 | 4/1998 | Shue et al. | 438/664 |
| 5,766,991 | 6/1998 | Chen | 438/305 |

OTHER PUBLICATIONS

P. Fornara and A. Poncet, Modeling of Local Reduction in TiSi$_2$ and CoSi$_2$ Growth Near Spacers in MOS Technologies: Influence of Mechanical Street and Main Diffusing Species, 1996, pp. 73–76, no month.

Digh Hisamoto et al., A Low–Resistance Self–Aligned T–Shaped Gate for High–Performance Sub–0.1–μm CMOS, Jun. 1997, IEEE Transactions on Electron Devices, vol. 44, No. 6, pp. 951–956.

G.E. Georgiou et al., Thermal Stability Limits of Thin TiSi$_2$ Effect on Submicron Line Resistance and Shallow Junction Leakage, May 1994, J. Electrochem. Soc., vol. 141, No. 5, pp. 1351–1356.

Atsushi Hori et al., A 0.05μm–CMOS with Ultra Shallow Source/Drain Junctions Fabricated by 5KeV Ion Implantation and Rapid Thermal Annealing, 1994, pp. 485–488, no month.

*Primary Examiner*—Michael Trinh
*Attorney, Agent, or Firm*—Harness, Dickey & Pierce, P.L.C.

[57] ABSTRACT

The method of the present invention is a method of including forming a gate oxide layer on the substrate. A polysilicon layer is formed on the gate oxide layer. Then, a photographic and etching steps are used to form a gate structure. An oxidation is performed on the substrate and the gate structure to form an first oxide layer on the substrate and on the surface of the polysilicon gate. A silicon nitride layer is deposited on the first oxide layer. A side-wall spacers is formed on the side walls of the gate structure, a first portion of the first oxide layer remaining between the gate structure and the side-wall spacers, and a second portion of the first oxide layer remaining under the side-wall spacers. Next, a first ion implantation performed into the substrate to form first doped ions regions to serves as source and drain region of the transistor. Then, the side-wall spacers is removed, therefore remained the second portion of the first oxide layer covered by the side-wall spacers. Subsequently, a second ion implantation performed through the second portion of the first oxide layer to form second doped ion regions to serve as an extended source and drain region of the transistor. A rapid thermal annealing performed to form an extended source and drain junction and aligned to the region of the side-wall spacers being disposed.

9 Claims, 4 Drawing Sheets

METHOD OF FORMING A SELF-ALIGNED SILICIDE MOSFET WITH AN EXTENDED ULTRA-SHALLOW S/D JUNCTION

BACKGROUND OF THE INVENTION

1. Field of the Invention

The present invention relates to a semiconductor device, especially to a method of fabricating a self-aligned silicide metal oxide semiconductor transistor (MOSFET) with an extended ultra-shallow S/D junction.

2. Description of the Prior Art

Metal oxide semiconductor field effect transistors (MOSFETs) have been traditionally used and widely applied in the semiconductor technologies. According to the trend of integrated circuits, the fabrication of the MOSFET also involves various issues such as short channel effect and the generation of parasitic capacitance. One of the issues is hot carriers that will inject into gate oxide, which is has been overcome by the development of light doped drain (LDD) structure.

The salicide with extension S/D junction structure has received a lot of attention, recently. With the advent of Ultra large Scale Integrated (ULSI) technologies, the sizes of semiconductor devices have gotten smaller and smaller than ever, resulting in the packing density of a wafer increasing continuously. Self aligned silicide (SALICIDE) technology is widely used to increase the packing density of ULSI circuits and to reduce the interconnect resistance for high speed operation. Please see the references by P. Fornara, et al., in IEDM Tech. Dig., p.73, 1996 and D. Hisamoto, et al., IEEE Trans. Electron Devices, vol. ED-44, p.951, 1997.

With the salicide structure, reduced parasitic and increased current drivability have made it possible to achieve extremely short gate delay times in a ring oscillator. However, salicide structures have not been perfected, mainly because the silicide layers used to reduce the resistance of the source/drain and gate electrode suffer from size effects. Furthermore, and as mentioned in the reference by G. E. Georgious, et al. J. Electrochem Soc., vol. 141, p.1351, 1994, the SALICIDE process will result in a higher junction leakage due to the metal penetration into the Si substrate to spike the junction and/or the residual metal or silicide across the LDD spacer causing the bridge between the adjacent devices.

The process to form the extended ultra-shallow source/drain junctions was suggested in the reference by A. Hori, et al., in IEDM Tech. Dig., p485, 1994. In this process, ultra shallow source/drain junctions were developed on the basis of 5 KeV ion implantation technology and rapid thermal annealing.

SUMMARY OF THE INVENTION

It is an object of the present invention to provide a method of fabricating a self-aligned silicide metal oxide semiconductor transistor (MOSFET) with an extended ultra-shallow S/D junction.

The method of the present invention includes forming a gate oxide layer on the substrate. A polysilicon layer is formed on the gate oxide layer. Next, lithographic and etching steps are used to form a gate structure. An oxidation step is performed on the substrate and the gate structure to form a re-grown oxide layer on the substrate and on the surface of the polysilicon gate. Then, a silicon nitride layer is formed on the re-grown oxide layer. Subsequently, an anisotropic etching process is carried out to form side-wall spacers on the side walls of the gate structure. A first portion of the re-grown oxide layer remains between the gate structure and the side-wall spacers; and a second portion of the re-grown oxide layer remains under the side-wall spacers. Then, a metal layer is sputtered on the side-wall spacers, on the gate and on the substrate. A first thermal annealing is performed on the metal layer to form metal silicide on the top of the gate and on the substrate. After this step, an ion implantation is performed through the metal silicide into the substrate to form first doped ions regions to serve as source and drain region of the transistor. The side-wall spacers and the metal layer on the side-wall spacers are removed, with the second portion of the re-grown oxide layer remaining between the metal silicide and the gate structure.

A second thermal annealing is performed on the metal silicide to form a stable silicide phase. Then, a low energy ion implantation is performed through the second portion of the re-grown oxide layer to form second doped ion regions to serve as an extended source and drain region of the transistor. A RTP annealing is used to form an extended ultra-shallow S/D junction and aligned to the region of the side-wall spacers being disposed.

DESCRIPTION OF THE PREFERRED EMBODIMENT

The present invention will be described in detail with reference to drawings. The purpose of the present invention is to provide a method for fabricating a self-aligned silicide metal oxide semiconductor transistor (MOSFET). The detailed processes will be described as follows.

Figure 1:
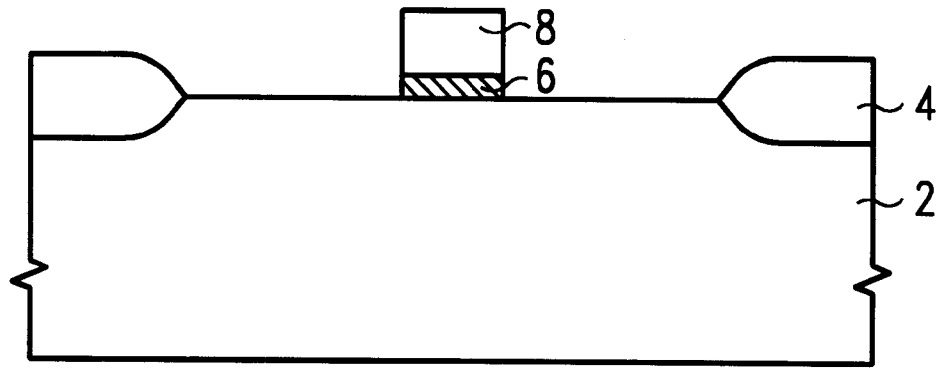
FIG. 1 is a cross-sectional view of the semiconductor wafer of the present invention illustrating the step of forming a gate structure on a semiconductor substrate according to the present invention.

Referring to FIG. 1, in a preferred embodiment, a single crystal silicon substrate 2 with a <100> crystallographic orientation is provided. A plurality of thick field oxide (FOX) regions 4 are formed to provided isolation between devices on the substrate. For example, the FOX regions 4 can be formed via lithography and etching steps to etch a silicon nitride-silicon dioxide composition layer. After the photoresist is removed and wet cleaned, thermal oxidation in an oxygen-steam environment is used to grow the FOX region 4 to a thickness of about 3000–8000 angstroms. The FOX region 4 can be replaced by a plurality of shallow trench isolations, as is well known in the art. Next, a silicon dioxide layer 6 is formed on the top surface of the substrate 2 to serve as a gate oxide layer. Typically, the silicon dioxide layer 6 is formed in oxygen ambient at a temperature of about 700 to 1100 Centigrade degrees. In this embodiment, the thickness of the silicon dioxide layer is approximately 20 to 250 angstroms. Alternatively, the oxide layer 6 may be formed using any suitable oxide chemical compositions and procedures.

A polysilicon layer 8 is then deposited on the FOX regions 4 and the silicon dioxide layer 6 using a low-pressure chemical vapor deposition process. In this embodiment, the thickness of the polysilicon layer 8 is about 500 to 4000 angstroms. Next, standard lithography and etching steps are used to etch the silicon dioxide 6 and the polysilicon layer for forming a gate silicon structure consisting of the gate oxide 6 and the polysilicon 8.

Figure 2:
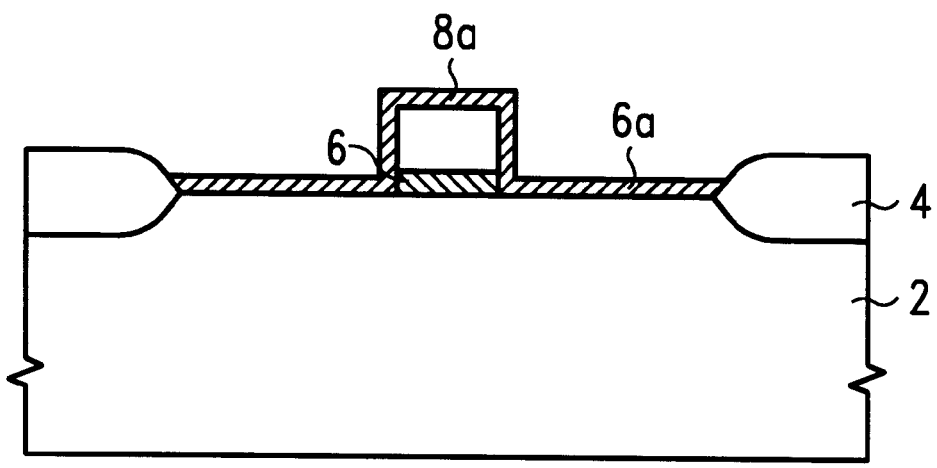
FIG. 2 is a cross-sectional view of the semiconductor wafer illustrating the step of forming a pad oxide layer on a semiconductor substrate and a polyoxide layer on the surface of poly-silicon gate according to the present invention.

Referring to FIG. 2, a thin pad oxide 6a is re-grown on the substrate and a polyoxide 8a is grown on the surface of the polysilicon gate 8 by performing a thermal oxidation step. In this preferred embodiment, the pad oxide 6a and the polyoxide are formed in the oxygen ambient or steam at a temperature of about 700 to 1100 Centigrade degrees, the thickness of the thin pad oxide layer is approximately 20 to 300 angstroms and the thickness of the polyoxide is about 50 to 400 angstroms. The re-grown thin pad oxide layer 6a is used to recover the etching damage that caused in the step of defining gate structure.

Figure 3:
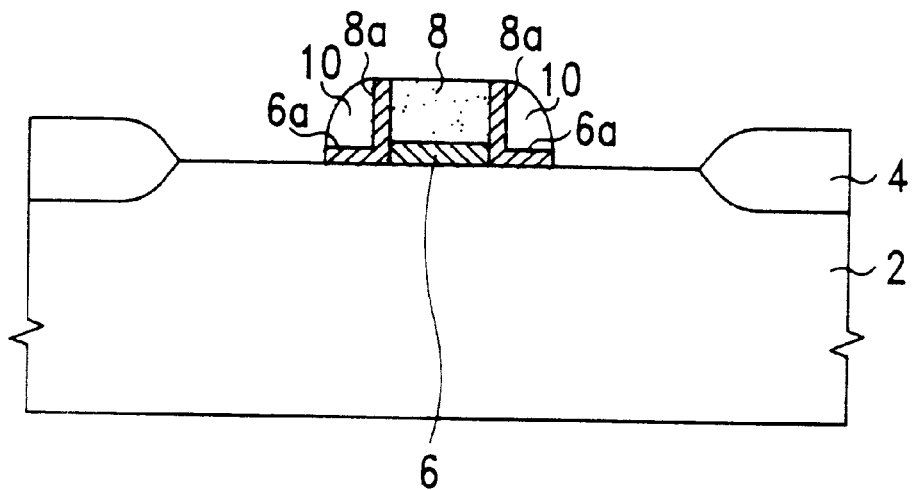
FIG. 3 is a cross-sectional view of a semiconductor wafer illustrating the step of forming a silicon nitride side-wall spacers according to the present invention.

Turning to FIG. 3, silicon nitride side-wall spacers 10 are formed on the side walls of the gate 8. In order to achieve this an anisotropic etching is used followed by depositing a silicon nitride layer 10 on the pad oxide 6a and on the polyoxide 8a layer. The first portion of the polyoxide layer 8a on the top of the polysilicon gate 8 is removed by the etching, therefore, the top of gate 8 is exposed. A second portion of the polyoxide layer 8a is remained between the gate polysilicon 8 and the side-wall spacers 10. Similarly, a portion of the pad oxide 6a layer laid under the side-wall spacers 10 are also remain on the substrate 2.

Figure 4:
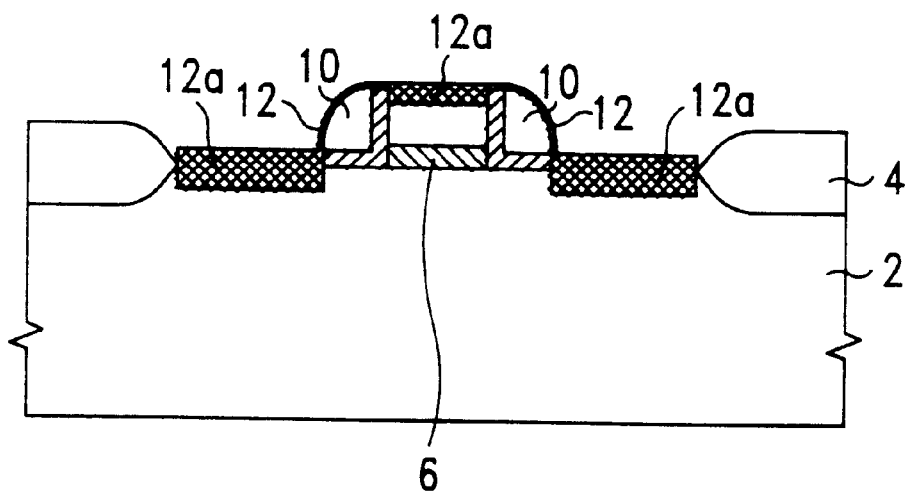
FIG. 4 is a cross-sectional view of a semiconductor wafer illustrating the step of depositing a refractory and/or noble metal and then first anneal step to form salicide according to the present invention.

Referring next to FIG. 4, a metal silicide layer is formed on the top of the gate 8, the side-wall spacers 10, and the substrate 2. In an embodiment, a metal layer 12, such as, Ti, Co, W, Pt, Ni etc. is deposited on the gate 8, on the side-wall spacers 10, and on the substrate 2. Then, a first annealing is used to react the metal layer 12 with the substrate 2 and the polysilicon gate 8 to form silicides 12a at a temperature range of about 350 to 750 Centigrade degrees for 5~30 minutes for furnace anneal, and 10~60 seconds for RTP anneal.

Figure 5:
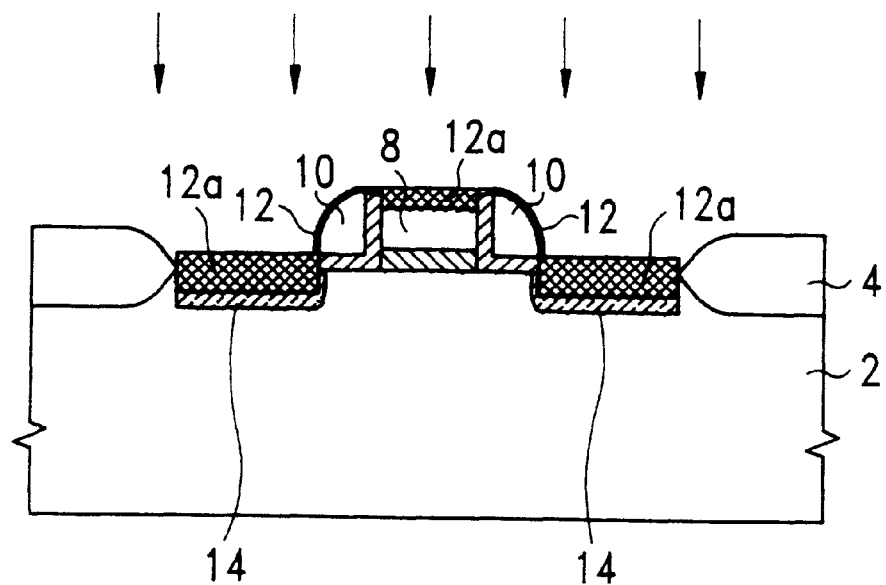
FIG. 5 is a cross-sectional view of a semiconductor wafer illustrating the step of performing a high dosage S/D/G ion implantation and a second anneal step to form the stable silicide phase according to the present invention.

Referring next to FIG. 5, a blanket high dosage ion implantation to implant appropriate impurities into the polysilicon gate 8, the side-wall spacers 10, and the substrate 2 through the silicides 12a to form active regions (i.e., the source and drain) 14 in the substrate 2. The gate 8 implanted with the ions to increase its conductivity. The dosage and the implantation energy of this step are respectively about $5 \times 10^{14}$ to $5 \times 10^{16}$ atoms/cm$^2$, about 10 to 150 KeV. After the high dosage ion implantation was done, then a second annealing process is used at a temperature range of about 700 to 1000 Centigrade degrees for 5~30 minutes for furnace anneal, and 10~60 seconds for RTP annealing to form a stable silicide phase.

Figure 6:
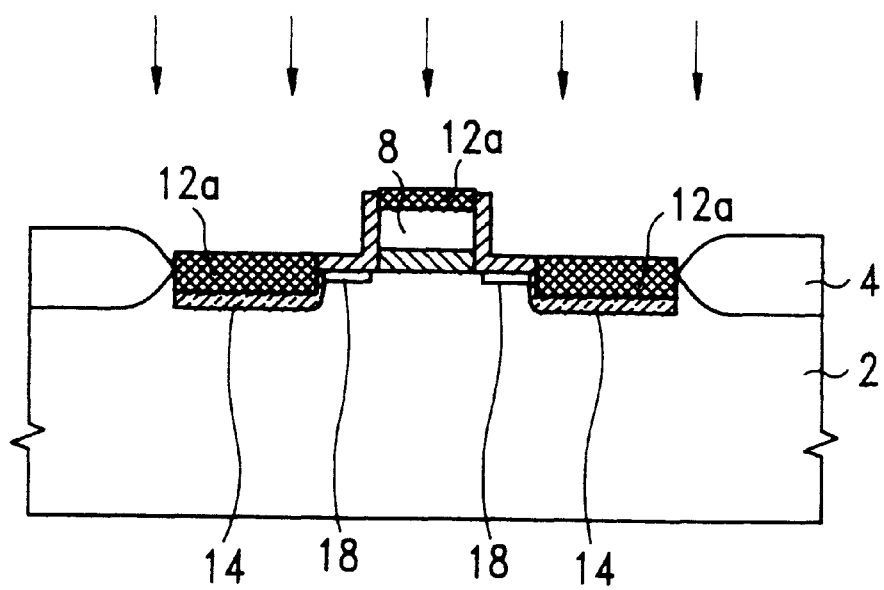
FIG. 6 is a cross-sectional view of a semiconductor wafer illustrating the step of performing a low energy S/D ion implantation according to the present invention.

Turning to FIG. 6, the nitride spacers 10 and non-reacted metal residual 12 are removed. In an embodiment, the nitride spacers can be removed by hot $H_3PO_4$ solution. Thus, a metal silicide layer 12a is self-aligned formed on the desired region, that is source and drain 14, and polysilicon gate 8. Then, a very low energy ion implantation is performed to dope ions into the substrate 2. Extended source and drain 18 are generated in the substrate 2 and aligned to the region that the nitride spacer 10 has disposed. The dosage of the implantation is about $2 \times 10^{13}$ to $2 \times 10^{15}$ ions/cm$^2$. The implantation energy is about 0.1 to 20 KeV.

Figure 7:
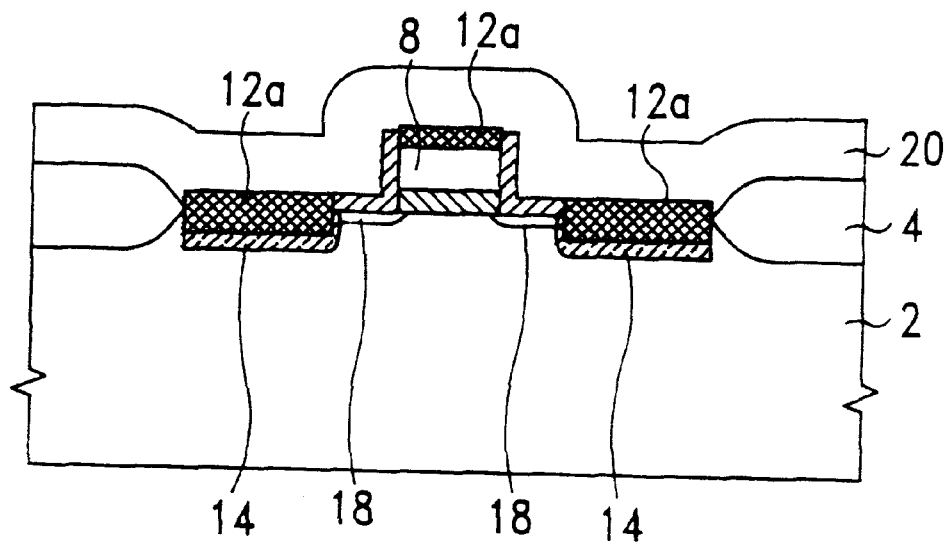
FIG. 7 is a cross-sectional view of a semiconductor wafer illustrating the step of depositing a thick CVD oxide layer on the gate and the substrate and performing a RTP annealing process to form an extended ultra-shallow S/D junction according to the present invention.

As can be seen in FIG. 7, a thick oxide film 20 is formed by chemical vapor deposition system subsequently over the polysilicon gate 8 and on the substrate 2. In this embodiment, the thick oxide film can be a silicon dioxide film, a TEOS oxide film, a BPSG film, or a PSG film, etc. The thickness of the thick oxide film is about 2000 to 10000 angstroms. Then, a rapid thermal process is performed for annealing. Thus, an extended ultra shallow source and drain junction 18 is formed. In this preferred embodiment, the rapid thermal annealing is performed at the temperature range of approximately 700 to 1050 Centigrade degrees for about 10~60 seconds.

Figure 8:
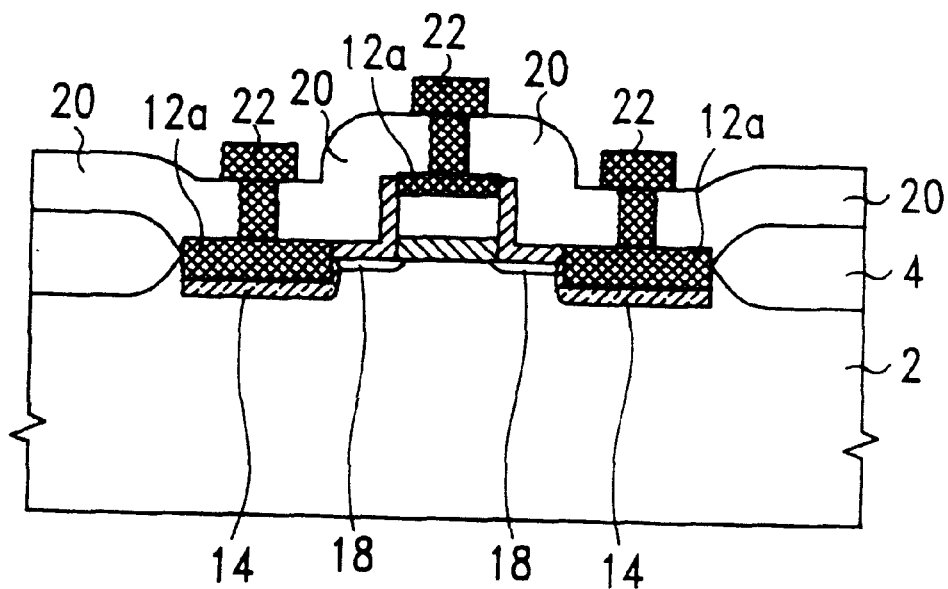
FIG. 8 is a cross-sectional view of a semiconductor wafer illustrating the step of forming the source, drain, and gate metal contact according to the present invention

Next, referring to FIG. 8, the metallization 22 of source, drain 14 and gate 8 are formed by using a standard contact hole process and a metal plug process.

Due to the method proposed above, the benefits of this invention are (1) the lower leakage of self-aligned silicide MOSFET could be obtained by using the disposable nitride/oxide L-shape LDD spacer; and (2) an extended ultra-shallow S/D junction could be easily obtained by using the very low energy implant and RTP anneal.

As is understood by a person skilled in the art, the foregoing preferred embodiment of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a transistor with an extended source and drain junction in a semiconductor substrate, said method comprising the steps of:

forming a gate oxide layer on said substrate;

forming a polysilicon layer on said gate oxide layer;

patterning said polysilicon layer and said gate oxide layer to form a gate structure;

performing an thermal oxidation on said substrate and said gate structure to form an first oxide layer on said substrate and on the surface of said gate structure;

forming a dielectric layer on said first oxide layer;

etching said dielectric layer and said first oxide layer to form side-wall spacers on the side walls of said gate structure, a first portion of said first oxide layer remaining between the gate structure and said side-wall spacers, a second portion of said first oxide layer remaining under said side-wall spacers;

forming a metal layer on said side-wall spacers, on said gate structure and on said substrate;

performing a first annealing on said metal layer to form metal silicide on the top of said gate structure and on said substrate;

performing a first ion implantation through said metal silicide into said substrate to form a first doped ions regions to serve as source and drain region of said transistor;

performing a second annealing on said metal silicide to form a stable silicide phase;

removing said side-wall spacers and unreacted metal layer on said side-wall spacers, therefore remaining said second portion of said first oxide layer between said metal silicide and said gate structure;

performing a second ion implantation through said second portion of said first oxide layer to form a second doped ion regions to serve as an extended source and drain region of said transistor; and performing a rapid thermal annealing to form an extended source and drain junction and aligned to the region of said side-wall spacers being disposed.

2. The method of claim 1, wherein said dielectric layer comprises silicon nitride.

3. The method of claim 1, wherein said dielectric side-wall spacers are removed by hot phosphoric acid solution.

4. The method of claim 1, wherein said thermal oxidation is performed at a temperature about 700 to 1100 centigrade.

5. The method of claim 1, wherein said first thermal annealing is performed at a temperature about 350 to 700 centigrade.

6. The method of claim 1, wherein said second thermal annealing is performed at a temperature about 700 to 1000 centigrade.

7. The method of claim 1, wherein said first ion implantation have implantation dosage about $5\times10^{14}$ to $5\times10^{16}$ ions/cm$^2$, and implantation energy about 10 to 150 KeV.

8. The method of claim 1, wherein said second ion implantation have implantation dosage about $2\times10^{13}$ to $2\times10^{15}$ ions/cm$^2$, and implantation energy about 0.1 to 20 KeV.

9. The method of claim 1, wherein said rapid thermal annealing is performed at a temperature about 700 to 1050 centigrade for 10~60 seconds.

* * * * *